(12) United States Patent
Koshimizu et al.

(10) Patent No.: US 8,829,387 B2
(45) Date of Patent: Sep. 9, 2014

(54) PLASMA PROCESSING APPARATUS HAVING HOLLOW ELECTRODE ON PERIPHERY AND PLASMA CONTROL METHOD

(75) Inventors: Chishio Koshimizu, Nirasaki (JP); Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 507 days.

(21) Appl. No.: 13/206,607

(22) Filed: Aug. 10, 2011

(65) Prior Publication Data

US 2012/0037597 A1 Feb. 16, 2012

Related U.S. Application Data

(60) Provisional application No. 61/377,497, filed on Aug. 27, 2010.

(30) Foreign Application Priority Data

Aug. 11, 2010 (JP) ................. 2010-180237

(51) Int. Cl.
*B23K 10/00* (2006.01)
*H01J 37/32* (2006.01)
(52) U.S. Cl.
CPC ..... *H01J 37/32091* (2013.01); *H01J 37/32596* (2013.01); *H01J 37/32697* (2013.01)
USPC ............ 219/121.54; 219/121.43; 219/121.52; 118/723 E; 315/111.21; 156/345.48
(58) Field of Classification Search
CPC .................................. H05H 1/46; H95H 1/30
USPC .............. 219/121.4, 121.41, 121.43, 121.44, 219/121.52; 118/723 R, 723 E; 315/111.21; 156/345.34, 345.43, 345.44, 345.47, 156/345.48
See application file for complete search history.

(56) References Cited

U.S. PATENT DOCUMENTS 5,647,912 A * 7/1997 Kaminishizono et al. .... 118/719
6,354,240 B1 * 3/2002 DeOrnellas et al. ...... 118/723 E
(Continued)

FOREIGN PATENT DOCUMENTS

CN 1973363 5/2007
CN 101789362 A 7/2010
(Continued)

*Primary Examiner* — Mark Paschall
(74) *Attorney, Agent, or Firm* — Pearne & Gordon LLP

(57) ABSTRACT

There is provided a plasma processing apparatus capable of performing a uniform plasma process on a substrate by controlling a plasma distribution within a chamber to a desired state and uniformizing a plasma density within the chamber. The plasma processing apparatus includes an evacuable chamber 11 for performing a plasma process on a wafer W; a susceptor 12 for mounting the wafer W within the chamber 11; an upper electrode plate 30*a* facing the susceptor 12 with a processing space S; a high frequency power supply 20 for applying a high frequency power to one of the susceptor 12 and the upper electrode plate 30*a* to generate plasma within the processing space S; and an inner wall member facing the processing space S. Hollow cathodes 31*a* to 31*c* are formed at the upper electrode plate 30*a* connected with a DC power supply 37 for adjusting a sheath voltage.

15 Claims, 7 Drawing Sheets

(56) References Cited

U.S. PATENT DOCUMENTS

| | | | |
|---|---|---|---|
| 6,528,947 B1 * | 3/2003 | Chen et al. | 315/111.21 |
| 7,204,921 B2 * | 4/2007 | Yajima et al. | 204/298.08 |
| 7,878,145 B2 * | 2/2011 | Fang et al. | 118/712 |
| 2001/0023663 A1 | 9/2001 | Kazumi | |
| 2003/0106643 A1 * | 6/2003 | Tabuchi et al. | 156/345.35 |
| 2012/0145324 A1 | 6/2012 | Koshiishi | |
| 2013/0206720 A1 * | 8/2013 | Blom et al. | 216/13 |

FOREIGN PATENT DOCUMENTS

| | | |
|---|---|---|
| JP | 64-004481 A | 1/1989 |
| JP | 02-194526 A | 8/1990 |
| JP | 2000-323460 A | 11/2000 |
| JP | 2002-532828 A | 10/2002 |
| JP | 2003-068716 A | 3/2003 |
| JP | 2005-150317 A | 6/2005 |

* cited by examiner

_US 8,829,387 B2_

PLASMA PROCESSING APPARATUS HAVING HOLLOW ELECTRODE ON PERIPHERY AND PLASMA CONTROL METHOD

CROSS-REFERENCE TO RELATED APPLICATION

This application claims the benefit of Japanese patent application Ser. No. 2010-180237 filed on Aug. 11, 2010 and U.S. Provisional Application Ser. No. 61/377,497 filed on Aug. 27, 2010, the entire disclosures of which are incorporated herein by reference.

FIELD OF THE INVENTION

The present disclosure relates to a plasma processing apparatus capable of controlling a plasma distribution within a processing chamber and a plasma control method.

BACKGROUND OF THE INVENTION

In a manufacturing process of a semiconductor device or a flat panel display (FPD) such as a liquid crystal display (LCD), there is known a plasma processing apparatus for performing a plasma process on various kinds of substrates such as a glass substrate. The plasma processing apparatus may be classified into a capacitively coupled plasma processing apparatus and an inductively coupled plasma processing apparatus according to a method for generating plasma.

Known as a typical example of such a capacitively coupled plasma processing apparatus (hereinafter, simply referred to as a "CCP processing apparatus") is an apparatus in which two sheets of electrode plates are provided within a processing chamber and one of the two electrode plates is connected with a high frequency power supply while the other is grounded. By way of example, in such a CCP processing apparatus, an electric field is generated between the electrode plates by applying a high frequency power to the one of the electrode plates from the high frequency power supply. As a result, electrons are generated in a processing space between the electrode plates. The electrons are accelerated by the electric field generated by the high frequency power and collide with molecules of a processing gas, so that capacitively coupled plasma is generated. Accordingly, a plasma process is performed on a substrate by using the plasma.

In the CCP processing apparatus, since plasma in a peripheral region of the chamber is diffused, a plasma density in the peripheral region of the chamber is decreased. Thus, a plasma density in a central region of the chamber tends to be higher than that in the peripheral region thereof. Accordingly, a plasma density within the chamber may become non-uniform and there is a problem that it may not be possible to perform a uniform plasma process on the substrate.

To solve the problem, there has been proposed a plasma processing apparatus including an electrode plate provided with a hollow cathode structure within a processing chamber (see, for example, Patent Document 1). By using the hollow cathode structure, it has been attempted to uniformize plasma distribution within the processing chamber and perform a uniform plasma process on a substrate.

Patent Document 1: Japanese Patent Laid-open Publication No. 2003-068716

However, even in the plasma processing apparatus having the hollow cathode structure formed in the processing chamber, a density or a distribution range of the generated plasma mainly depends on a shape of the hollow cathode structure, e.g., a size and a depth of grooves or hole. Thus, it may be still difficult to control the plasma density in the processing chamber to a desired state.

BRIEF SUMMARY OF THE INVENTION

In view of the foregoing, the present disclosure provides a plasma processing apparatus and a plasma control method capable of controlling a plasma distribution within a processing chamber to a desired state and uniformizing a plasma density within the processing chamber. Accordingly, by using the plasma processing apparatus and the plasma control method, a uniform plasma process can be performed on a substrate.

In accordance with one aspect of the present disclosure, there is provided a plasma processing apparatus including: an evacuable processing chamber for performing therein a plasma process on a substrate; a substrate mounting table for mounting thereon the substrate within the processing chamber; a facing electrode disposed to face the substrate mounting table with a processing space provided therebetween; a high frequency power supply for applying a high frequency power to one of the substrate mounting table and the facing electrode to generate plasma within the processing space; and an inner wall member facing the processing space. Further, a hollow cathode structure is formed at a portion of the inner wall member facing a peripheral region of the processing space, and the inner wall member is connected with a power supply for adjusting a sheath voltage.

Further, the power supply for adjusting the sheath voltage may be a DC power supply.

Moreover, the inner wall member may be made of a conductor or a semiconductor.

The DC power supply may apply to the inner wall member a DC voltage ranging from about −50 V to about −1500 V, and an absolute value of the DC voltage may be larger than that of a self bias voltage of the inner wall member.

The power supply for adjusting the sheath voltage may be a high frequency power supply that applies a high frequency power of a frequency range equal to or less than about 27 MHz.

Further, the inner wall member may be made of one of a conductor, a semiconductor, a conductor coated with a dielectric and a semiconductor coated with a dielectric.

Furthermore, the high frequency power supply may apply to the inner wall member a high frequency power of about 0 kW to about 5 kW.

The hollow cathode structure may include a circular ring-shaped groove, and the groove may be formed coaxially with respect to the substrate mounting table.

The hollow cathode structure may include a multiple number of grooves, and the multiple number of grooves may be formed concentrically and coaxially with respect to the substrate mounting table.

In the hollow cathode structure, a width of the groove may be about 2 mm to about 20 mm.

In the hollow cathode structure, a depth of the groove may be about 2 mm to about 20 mm, and an aspect ratio of the groove may be about 0.5 to about 10.

In the hollow cathode structure, a width and/or a depth of the groove may increase as a distance of the groove from a center of the processing space increases.

In the hollow cathode structure, a bottom corner of the groove may be rounded.

Further, the inner wall member may be an upper electrode plate.

In accordance with another aspect of the present disclosure, there is provided a plasma control method performed by a plasma processing apparatus. The plasma processing apparatus may accommodate a substrate in a processing space of an evacuable processing chamber for performing a plasma process on the substrate; generate plasma within the processing space by capacitive coupling; and perform the plasma process on the substrate by the plasma. Further, the plasma processing apparatus may include a hollow cathode structure formed in an inner wall member facing a peripheral region of the processing space. The plasma control method applies a voltage for adjusting a sheath voltage to the inner wall member to control plasma density within a region of the processing space corresponding to the hollow cathode structure.

In the plasma control method, the voltage for adjusting the sheath voltage may be a DC voltage.

In the plasma control method, the DC voltage may be about −50 V to about −1500 V, and an absolute value of the DC voltage may be larger than that of a self bias voltage of the inner wall member.

In the plasma control method, the voltage for adjusting the sheath voltage may be a high frequency power of a frequency range equal to or less than about 27 MHz.

In the plasma control method, the high frequency power supply may apply a high frequency power of about 0 kW to about 5 kW.

In accordance with the present disclosure, the plasma distribution within the processing chamber can be controlled to be a desired state. Thus, it may be possible to uniformize the plasma density within the processing chamber, and also possible to perform a uniform plasma process on the substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 3A shows a case where an ion concentration (Ne) of plasma is about $1\ e^{11}/cm^3$, and FIG. 3B shows a case where an ion concentration (Ne) of plasma is about $2\ e^{10}/cm^3$;

DETAILED DESCRIPTION OF THE INVENTION

Hereinafter, non-limiting embodiments of the present disclosure will be described in detail with reference to the accompanying drawings.

Figure 1:
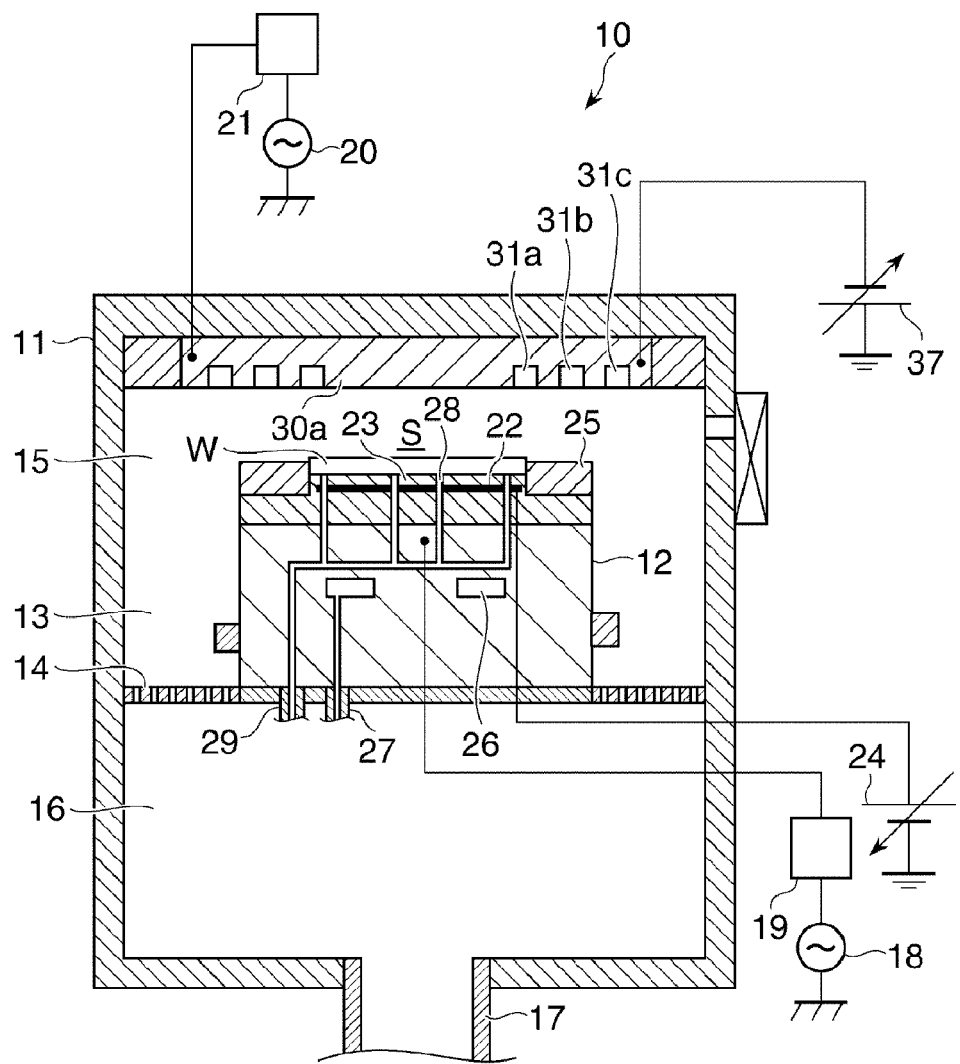
FIG. 1 is a cross sectional view schematically illustrating a configuration of a plasma processing apparatus in accordance with a first embodiment of the present disclosure.

FIG. 1 is a cross sectional view schematically illustrating a configuration of a plasma processing apparatus in accordance with a first embodiment of the present disclosure. This plasma processing apparatus performs a plasma process such as etching process or film forming process on, e.g., a semiconductor wafer (hereinafter, simply referred to as a "wafer").

As depicted in FIG. 1, a plasma processing apparatus may include a processing chamber 11 that accommodates therein a substrate (hereinafter, simply referred to as a "wafer") W. A cylindrical susceptor 12 for mounting thereon the wafer W is provided within the chamber 11. A side exhaust path 13 is formed between an inner sidewall of the chamber 11 and a side surface of the susceptor 12. An exhaust plate 14 is provided on the way of the side exhaust path 13.

The exhaust plate 14 is a plate-shaped member having a multiple number of through holes and serves as a partition plate that partitions the inside of the chamber 11 into an upper region and a lower region. In the upper region 15 of the inside of the chamber 11 partitioned by the exhaust plate 14, plasma is generated as described below. Further, the lower region (hereinafter, referred to as an "exhaust room (manifold)") 16 of the inside of the chamber 11 is connected with an exhaust pipe 17 for exhausting a gas from the inside of the chamber 11. The exhaust plate 14 confines or reflects plasma generated in the upper region 15, and thus, prevents a leakage of the plasma into the manifold 16.

The exhaust pipe 17 may be connected with a TMP (Turbo Molecular Pump) and a DP (Dry pump) (both are not shown). These pumps evacuate and depressurize the inside of the chamber 11 to a certain pressure level. Further, an internal pressure of the chamber 11 may be controlled by an APC value (not shown).

The susceptor 12 within the chamber 11 is connected with a first high frequency power supply 18 via a first matching unit 19. The first high frequency power supply 18 applies to the susceptor 12 a high frequency bias power having a frequency of, e.g., about 2 MHz. Thus, the susceptor 12 serves as a lower electrode. Further, the first matching unit 19 reduces reflection of the high frequency power from the susceptor 12 and maximizes an efficiency of applying the high frequency power to the susceptor 12.

Provided on the susceptor 12 is an electrostatic chuck (ESC) 23 having therein an electrostatic electrode plate 22. The electrostatic chuck 23 has a step-shaped portion and is made of, e.g., ceramics.

The electrostatic electrode plate 22 is electrically connected with a DC power supply 24. If a positive DC voltage is applied to the electrostatic electrode plate 22, a negative potential is generated in a surface (hereinafter, referred to as a "rear surface") of the wafer W facing the electrostatic chuck 23. Therefore, an electric field is generated between the electrostatic electrode plate 22 and the rear surface of the wafer W. The wafer W is attracted to and held on the electrostatic chuck 23 by a Coulomb force or a Johnsen-Rahbek force caused by the electric field.

Further, a focus ring 25 is mounted on a horizontal portion of the step-shaped portion of the electrostatic chuck 23 so as to surround the wafer W attracted and held on the electrostatic chuck 23. The focus ring 25 is made of, for example, silicon (Si) or silicon carbide (SiC).

A coolant cavity 26 of, e.g., a circular ring-shape is formed within the susceptor 12. A coolant of a low temperature, such as cooling water or Galden (registered trademark) is supplied and circulated into the coolant cavity 26 through a coolant line 27 from a chiller unit (not shown). The susceptor 12 cooled by the coolant cools the wafer W and the focus ring 25 via the electrostatic chuck (ESC) 23.

A multiple number of heat transfer gas supply holes 28 are opened to a surface (hereinafter, referred to as an "attraction surface") of the electrostatic chuck 23 where the wafer W is held. The heat transfer gas supply holes 28 are connected with a heat transfer gas supply unit (not illustrated) via a heat transfer gas supply line 29. The heat transfer gas supply unit supplies a helium (He) gas as a heat transfer gas into a gap between the attraction surface of the electrostatic chuck 23 and the rear surface of the wafer W through the heat transfer gas supply holes 28. The He gas supplied into the gap between the attraction surface of the electrostatic chuck 23 and the rear surface of the wafer W effectively transfers heat of the wafer W to the electrostatic chuck 23.

An upper electrode plate 30a is provided at a ceiling of the chamber 11 and serves as a facing electrode that faces the susceptor 12 with a processing space S of the upper region 15 positioned therebetween.

The upper electrode plate 30a is made of a conductor such as, but not limited to, Si or a metal. Further, the upper electrode plate 30a is connected with a second high frequency power supply 20 via a second matching unit 21. The second high frequency power supply 20 applies to the upper electrode plate 30a a high frequency power (for plasma generation) of a relatively high frequency of, e.g., about MHz. Like the first matching unit 19, the second matching unit 21 also serves to reduce reflection of the high frequency power from the susceptor 12 and thus maximizes an efficiency of applying the high frequency power to the susceptor 12.

A non-illustrated processing gas supply unit for supplying a processing gas into the upper region 15 of the chamber 11 is connected to the chamber 11. The processing gas supply unit is connected to the upper region 15 of the chamber 11 via a gas inlet line (not shown) and supplies the processing gas into the upper region 15 of the chamber 11.

In this plasma processing apparatus 10, in order to control a plasma distribution within the processing space S to a desired state by controlling a hollow cathode discharge, a hollow cathode structure is formed at the upper electrode plate 30a serving as an inner wall of the chamber 11. To be specific, the hollow cathode structure is formed in a surface (hereinafter, referred to as a "bottom surface") of the upper electrode plate 30a facing the processing space S. The hollow cathode structure may include circular ring-shaped grooves 31a to 31c. Further, the grooves 31a to 31c are concentrically formed at positions of the upper electrode plate 30a corresponding to a peripheral region of the processing space S. Further, by way of example, the grooves 31a to 31c may be coaxially formed with respect to a central axis of the susceptor 12.

The upper electrode plate 30a is electrically connected with a DC power supply 37 via a non-illustrated filter for reducing leakage of RF power. The DC power supply 37 applies, for example, a negative DC voltage to the upper electrode plate 30a as a voltage for adjusting a sheath voltage. Further, since a self bias voltage (Vdc) of the upper electrode plate 30a is in a range of, e.g., about −100 V to about −300 V, an absolute value of the negative DC voltage is greater than or equal to that of the self bias voltage of the upper electrode plate 30a.

In the plasma processing apparatus 10 having the above-described configuration, a processing gas is introduced into the upper region 15 of the chamber 11 from a non-illustrated processing gas inlet line. Further, the introduced processing gas is excited into plasma by a high frequency power for plasma generation applied to the upper electrode plate 30a from the second high frequency power supply 20 via the second matching unit 21. Positive ions in the plasma are attracted toward the wafer W by a high frequency bias power applied to the susceptor 12 from the first high frequency power supply 18. As a result, a plasma etching process, for example, is performed on the wafer W.

An operation of each component of the plasma processing apparatus 10 is controlled by a CPU of a controller (not shown) included in the plasma processing apparatus 10 according to a program for the plasma etching process.

In accordance with the first embodiment, since the circular ring-shaped grooves 31a to 31c are formed at the bottom surface of the upper electrode plate 30a corresponding to the peripheral region of the processing space S, a plasma density in the peripheral region of the processing space S is increased and becomes almost equivalent to a plasma density in a central region of the processing space S. Accordingly, the plasma density within the processing space S may be uniformized, so that a uniform plasma process may be performed on the wafer W.

Furthermore, in accordance with the first embodiment, by selecting the inner wall member of the chamber 11 where the circular ring-shaped grooves 31a to 31c are to be formed and positions thereof; and adjusting the DC voltage applied to the inner wall member where the grooves 31a to 31c are formed, it is possible to control the plasma density within the region of the processing space S facing the grooves 31a to 31c. In addition, it is possible to control the plasma density within the entire processing space S.

In the present embodiment, the hollow cathode structure refers to circular ring-shaped grooves or holes (hereinafter, simply referred to as "grooves") or combinations thereof, which are formed in the bottom surface of the upper electrode plate 30a.

Figure 2A:
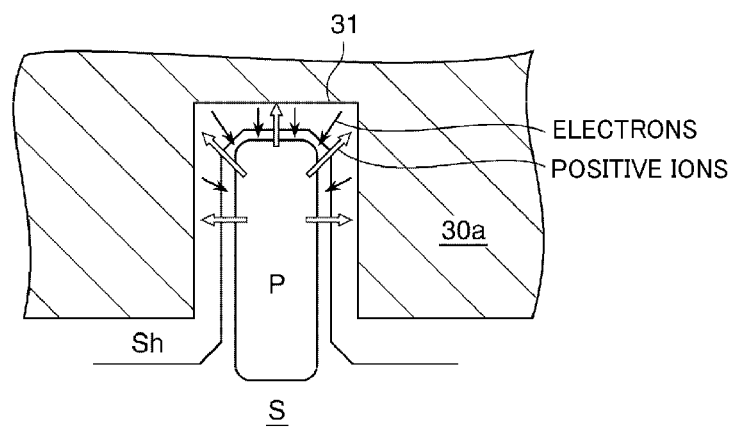
FIGS. 2A and 2C are diagrams for describing the plasma control principle in accordance with the present disclosure.

The plasma processing apparatus 10 may include the upper electrode plate 30a made of a conductor such as Si so as to face the plasma (not shown) within the processing space S. Since a potential of the plasma and a potential of the upper electrode plate 30a are different, a sheath is generated between the plasma and the upper electrode plate 30a. The sheath accelerates the positive ions toward the upper electrode plate 30a and also accelerates electrons in an opposite direction, i.e., toward the processing space S. Here, in the hollow cathode structure (hereinafter, simply referred to as "hollow cathode") 31 of the upper electrode plate 30a, a sheath Sh is generated along the surface of the hollow cathode 31 (FIG. 2A). Since the sheath Sh accelerates the positive ions or the electrons in a thickness direction thereof, the electrons are concentrated in the hollow cathode 31 and an electron density is increased. As a result, high-density plasma P is generated within the hollow cathode 31.

Here, if the power of the DC voltage applied to the upper electrode plate 30a is varied, a bias potential Vdc in the hollow cathode 31 may also be varied. Therefore, a sheath voltage defined as a difference between a plasma potential Vpp and the bias potential Vdc is varied. If the sheath voltage is varied, the thickness of the sheath Sh is also varied. For example, a region where the plasma P may exist within the hollow cathode 31 is varied. As a consequence, since the density or the existence region of the plasma within the hollow cathode 31 is varied, a plasma density in the region of the processing space S corresponding to the hollow cathode 31 is locally varied. Thus, it becomes possible to control the plasma density within the processing space S by using the above-mentioned variation of the density or the existence region of the plasma.

In such a case, the thickness of the sheath Sh increases in proportion to the sheath voltage. If, however, the sheath Sh becomes excessively thick in the hollow cathode 31, which is a limited space, the plasma P may be extruded by the sheath Sh and may not exist within the hollow cathode 31. Thus, desirably, the thickness of the sheath Sh may be set to be equal to or less than about ½ of a width of the hollow cathode 31. Further, by reducing the depth or the width of each groove of the hollow cathode 31, it is possible to reduce an effect of increasing the plasma density by the hollow cathode.

Figure 2B:
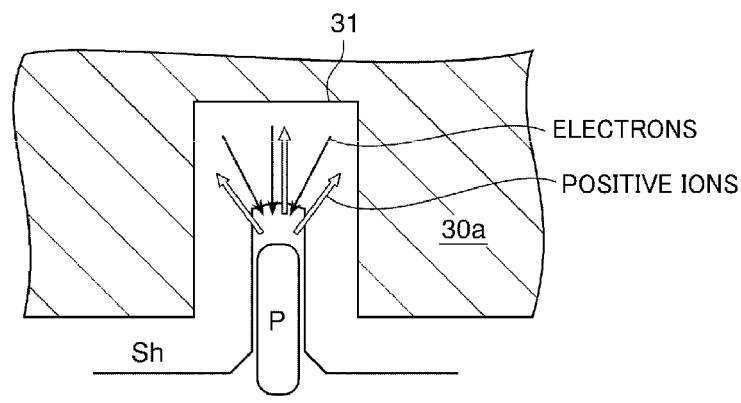
Figure 2C:
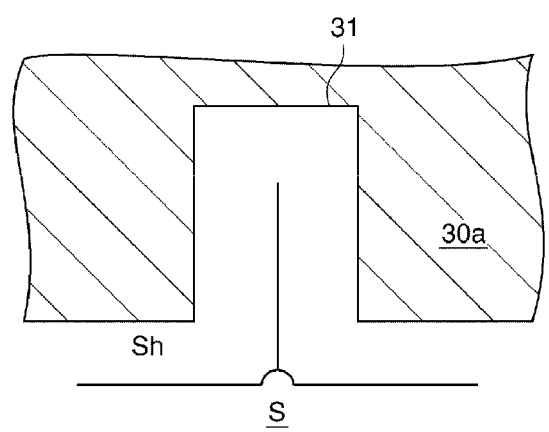

FIGS. 2A to 2C are diagrams for describing the plasma control principle in accordance with the present disclosure.

In FIG. 2A, since the sheath Sh is thin, the plasma P can be generated in a relatively wide region within the hollow cathode 31 and the generated plasma P may not be extruded from the inside of the hollow cathode 31 by the sheath Sh.

Referring to FIG. 2B, if a high DC voltage is applied to the upper electrode plate 30a, the sheath voltage is increased and the thickness of the sheath Sh within the hollow cathode 31 is also increased. As a result, the plasma P may be extruded from the hollow cathode 31 by the sheath Sh, so that the density or the existence region of the plasma P within the sheath Sh is decreased as compared to that in FIG. 2A.

Further, as shown in FIG. 2C, if a higher DC voltage is applied to the upper electrode plate 30a, the thickness of the sheath Sh formed along a wall surface of the hollow cathode 31 is increased and the inside of the hollow cathode 31 is completely filled with the sheath Sh. Therefore, all the plasma P within the hollow cathode 31 is extruded by the sheath Sh. That is, the plasma P may not be generated within the hollow cathode 31. Accordingly, it may not be possible to increase the plasma density in the region of the processing space S corresponding to the hollow cathode 31. Consequently, if the applied DC voltage is excessively high, the effect of increasing the plasma density by the hollow cathode discharge may be reduced.

As discussed above, in the plasma processing apparatus 10 of FIG. 1, by adjusting the DC voltage applied to the upper electrode plate 30a, the bias potential Vdc in the hollow cathodes 31a to 31c may be controlled. Thus, it may be possible to control the sheath voltage which is defined as a difference between the bias potential Vdc and the plasma potential Vpp. Accordingly, by generating plasma while controlling the sheath thickness, it may be possible to locally control the plasma density in the region of the processing space S corresponding to the hollow cathodes 31a to 31c. In addition, it may be possible to control the plasma density within the entire processing space S.

Figure 3A:
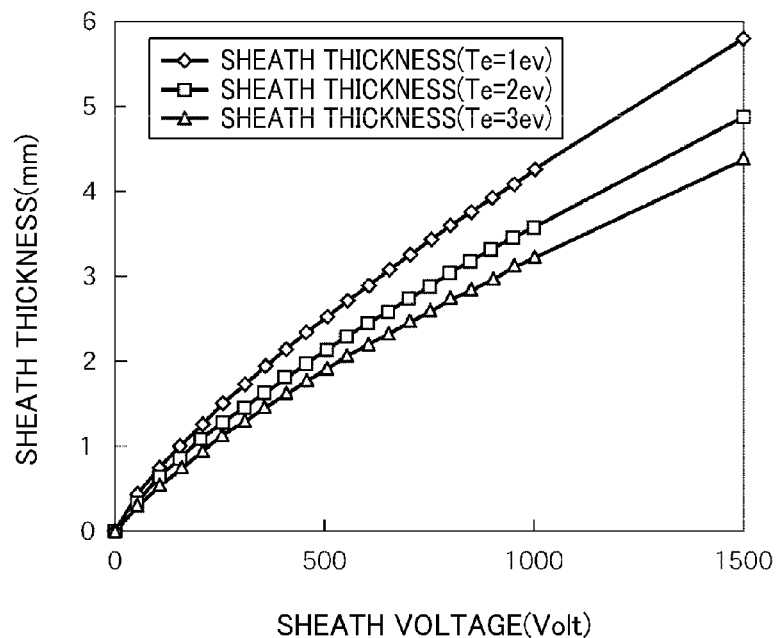
FIGS. 3A and 3B are graphs explaining a relationship between a sheath voltage and a sheath thickness.
Figure 3B:
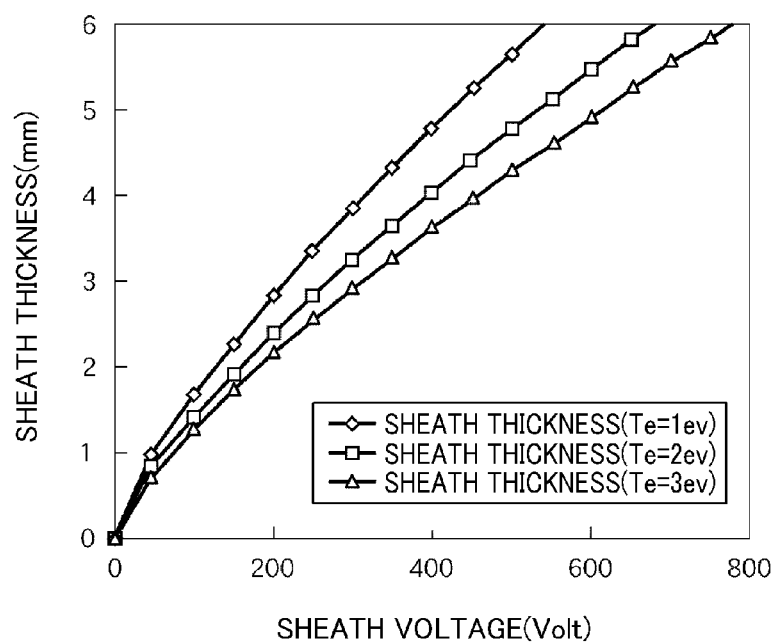

FIGS. 3A and 3B are diagrams for explaining a relationship between a sheath voltage and a sheath thickness in the plasma processing apparatus 10 of FIG. 1. FIG. 3A shows a case where an ion concentration (Ne) of plasma is about 1 $e^{11}/cm^3$, and FIG. 3B shows a case where an ion concentration (Ne) of plasma is about 2 $e^{10}/cm^3$.

As can be seen from FIG. 3A, when the electron concentration of plasma is about 1 $e^{11}/cm^3$, the sheath thickness at each electron temperature (Te=1 ev to 3 eV) increases as the sheath voltage increases to about 500 V, about 1000 V and about 1500 V.

Further, referring to FIG. 3B, when the electron concentration of plasma is about 2 $e^{11}/cm^3$, the sheath thickness at each electron temperature (Te=1 ev to 3 eV) increases as the sheath voltage increases to about 200 V, about 400 V, about 600 V and about 800 V.

FIGS. 3A and 3B also indicate that by adjusting the sheath voltage, the sheath thickness is varied and, thus, the plasma density can be controlled accordingly.

In this first embodiment, the DC voltage applied to the upper electrode plate 30a is in a range of, but not limited to, about −50 V to about −1500 V. Further, the absolute value of this DC voltage is set to be larger than that of the self bias voltage Vdc generated in the upper electrode plate 30a. If the absolute value of the DC voltage applied to the upper electrode plate 30a is equal to or less than that of the self bias voltage Vdc generated in the upper electrode plate 30a, there is a possibility that a current may not flow even if the DC voltage is applied. However, if the absolute value of the DC voltage applied to the upper electrode plate 30a is larger than that of the self bias voltage Vdc generated in the upper electrode plate 30a, the sheath thickness within the grooves of the hollow cathode can be varied and the hollow cathode discharge can be controlled. Accordingly, it is much easier to make the plasma distribution uniform.

Further, if the absolute value of the DC voltage applied to the upper electrode plate 30a is smaller than about 50 V, the effect of applying the DC voltage may be insufficient. Meanwhile, if the absolute value of the DC voltage is larger than about 1500, configuration of the apparatus may be complicated and the price of the apparatus may be increased, resulting in deterioration of practicality. Since the self bias voltage Vdc is small when the RF power for plasma generation is not applied to the upper electrode plate 30a, the DC voltage of about −50 V to about −1500 V may be applied as a voltage for adjusting the sheath voltage.

Further, an optimum range of the DC voltage applied to the upper electrode plate 30a may vary depending on a width or a depth of the hollow cathode, and depending on whether a high frequency (RF) power for plasma generation is applied to the upper electrode or to the lower electrode. Also, it may be varied depending on an internal pressure of the chamber, a kind of the processing gas, or the like. Accordingly, an optimum application voltage may be determined based on various conditions.

In the present embodiment, a cross sectional shape of the hollow cathodes 31a to 31c may not be limited to a rectangular shape, but may be other shapes such as a U shape, a triangular shape or a combination of these various shapes. Accordingly, it may be sufficient as long as there can be formed a recess where a hollow cathode discharge can be generated. The cross sectional shape of the hollow cathode, and the width and the depth of the hollow cathode can be made in various ways, and various combinations thereof can be used.

Furthermore, in the first embodiment, a width dimension of FIG. 1 (hereinafter, simply referred to as a "width") of the cross sectional shape of the circular ring-shaped hollow cathodes 31a to 31c may be, for example, about 2 mm to about 20 mm and, desirably, about 5 mm to about 20 mm. If the width of the hollow cathode is smaller than about 2 mm, the groove of the hollow cathode may be filled with the sheath in a short time and the plasma may be extruded. Thus, it may be difficult to increase the plasma density within the processing space S. Meanwhile, if the width of the hollow cathode is larger than about 20 mm, it may be difficult to form a sufficient number of grooves in which the hollow cathode discharge is generated. Therefore, it may be difficult to achieve a sufficient effect of increasing the plasma density by the hollow cathode.

In the present embodiment, a depth dimension of FIG. 1 (hereinafter, simply referred to as a "depth") of the cross sectional shape of the circular ring-shaped hollow cathodes 31a to 31c may be, e.g., about 2 mm to about 20 mm, and an aspect ratio of the hollow cathodes 31a to 31c is in a range of, e.g., about 0.5 to about 10. If the depth is smaller than about 2 mm, a hollow cathode effect may not be obtained sufficiently. Meanwhile, if the depth is larger than about 20 mm, the manufacturing cost of the electrode may be greatly increased. Further, if the aspect ratio is smaller than about 0.5, the hollow cathode effect may be deteriorated, and if the aspect ratio is larger than about 10, the manufacturing cost of the electrode may be increased.

In accordance with the first embodiment, it is desirable to round bottom corners of the hollow cathodes 31a to 31c. By rounding the bottom corners, positive ions accelerated by the sheath Sh may collide with the inner walls of the hollow cathodes 31a to 31c uniformly in a perpendicular direction thereto. Therefore, it may be possible to prevent deposits from adhering by a sputtering effect. In the plasma processing apparatus 10 having a configuration that the DC voltage is applied to the upper electrode plate 30a, the applied DC voltage flows to the ground through the processing space S or the like. If the deposits adhere to each component corresponding to the flow path of the DC voltage, the DC voltage cannot be applied. Thus, in order to prevent the deposits from being formed within the hollow cathodes 31a to 31c of the upper electrode plate 30a, it is desirable to round the bottom corners of the hollow cathodes 31a to 31c.

In the first embodiment, the hollow cathodes 31a to 31c may not necessarily be formed at the upper electrode plate 30a. Depending on a shape of each member within the chamber, it may be possible to form a recess having a shape similar to the hollow cathode at a contact portion between the members within the chamber. In order to control the plasma density to a desired state, a certain DC voltage from the DC power supply for adjusting the sheath voltage needs to be applied to a conductive member having the recess of a shape similar to the hollow cathode. Moreover, a member within the chamber can also be made of a semiconductor.

In the first embodiment, an apparatus that applies dual RF powers to the upper and the lower electrodes may be used as the plasma processing apparatus. However, the present disclosure may not be limited thereto. By way of example, the present disclosure may be also applicable to a plasma processing apparatus that applies dual RF powers to the lower electrode or other type of an apparatus.

Now, a modification example of the first embodiment will be explained.

Figure 4:
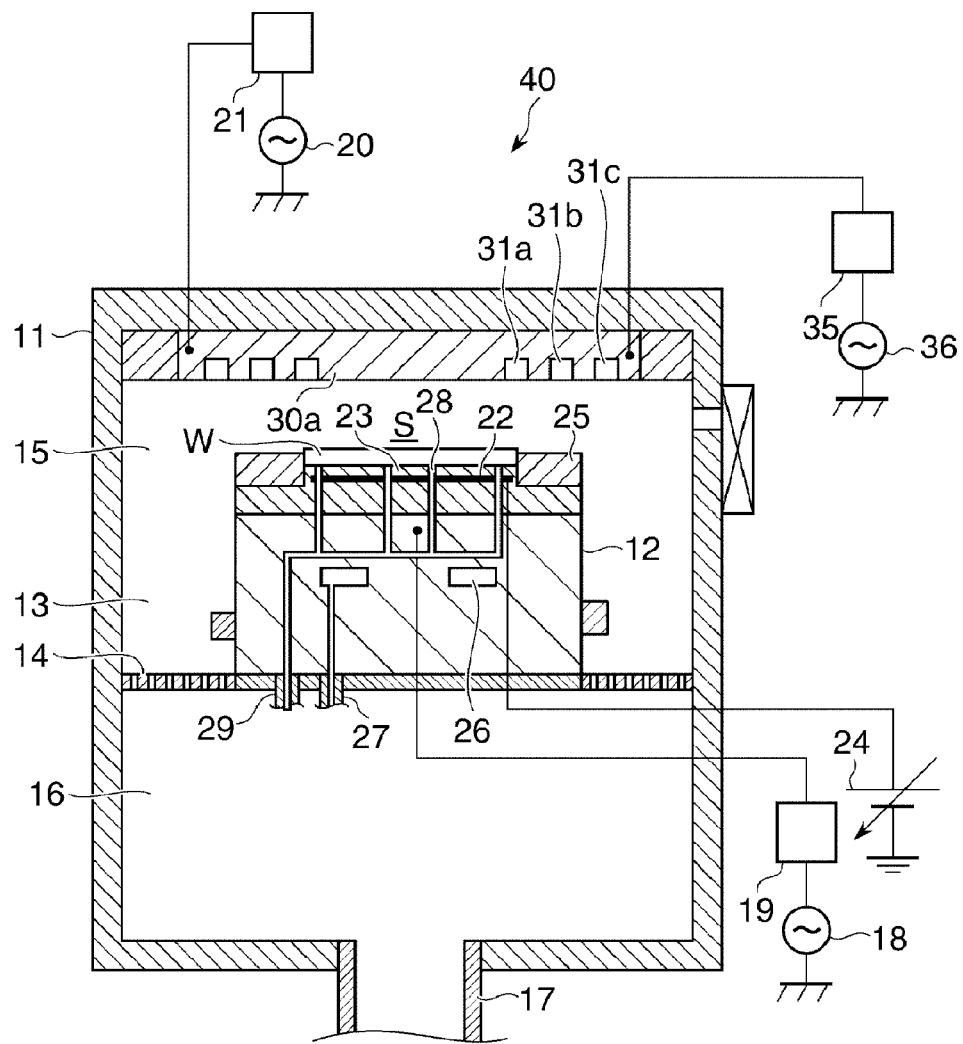
FIG. 4 is a cross sectional view schematically illustrating a configuration of a modification example of the plasma processing apparatus in accordance with the first embodiment.

FIG. 4 is a cross sectional view schematically illustrating a configuration of a modification example of the plasma processing apparatus in accordance with the first embodiment.

A plasma processing apparatus 40 in FIG. 4 is different from the plasma processing apparatus 10 of FIG. 1 in that, instead of the DC power supply 37 for applying the DC voltage, a high frequency power supply 36 is connected to the upper electrode plate 30a via a matching unit 35.

The high frequency power supply 36 applies to the upper electrode plate 30a a high frequency (RF) power having a frequency equal to or less than, e.g., about 27 MHz and a power of, e.g., about 0 kW to about 5 kW. By applying the high frequency power in such a frequency range and adjusting the power thereof, a bias potential Vdc in the hollow cathodes 31a to 31c can be controlled. Accordingly, a sheath voltage defined as a difference between a plasma potential Vpp and the bias potential Vdc can be controlled, so that a sheath thickness and a plasma density within a region of the processing space S facing the hollow cathodes can be controlled. If the frequency of the applied high frequency power exceeds about 27 MHz, only a thin sheath would be formed and this may make it difficult to control the plasma density.

In this modification example, the high frequency power is continuously applied to the upper electrode plate 30a. However, the high frequency power can be applied in a pulse pattern. By applying the high frequency power in the pulse pattern, intensity of the plasma within the hollow cathode can be varied intermittently, so that dissociation of radicals can be controlled.

In the plasma processing apparatus 40 of FIG. 4 having the high frequency power supply 36 as the power supply for adjusting the sheath voltage, an electrode plate made of, e.g., a conductor or a conductor coated with a dielectric may be used as the upper electrode plate 30a. That is, by way of example, an aluminum bulk member coated with, e.g., alumite, a $Y_2O_3$ coating material, Si or SiC may be used as a member forming the upper electrode plate 30a. Further, instead of the conductor, a semiconductor may be used.

Moreover, in this modification example, an in-chamber member may not necessarily be a conductor as long as a part of the in-chamber member to which the high frequency power is applied has conductivity.

Now, a plasma processing apparatus in accordance with a second embodiment of the present disclosure will be explained.

Figure 5:
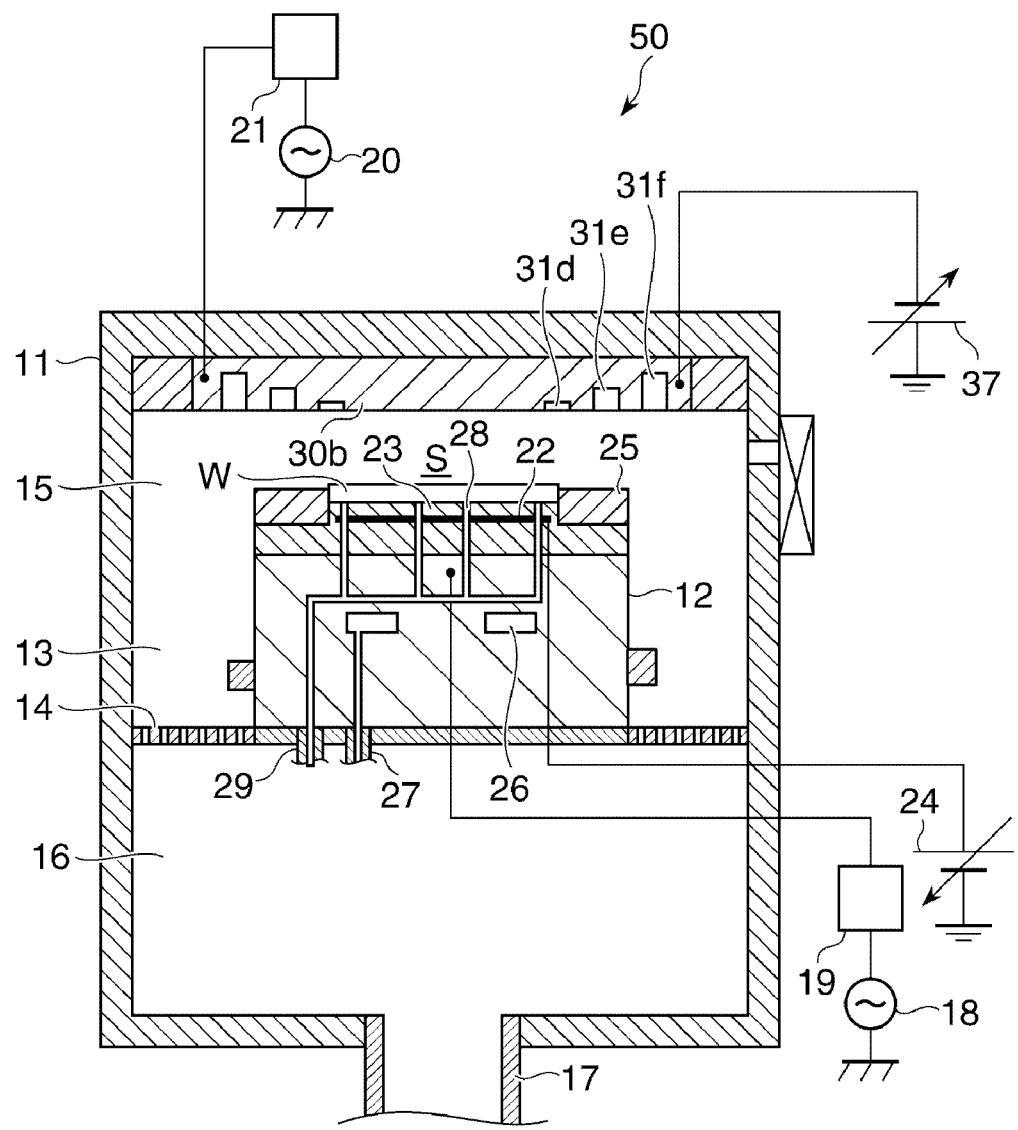
FIG. 5 is a cross sectional view schematically illustrating a configuration of a plasma processing apparatus in accordance with a second embodiment.

FIG. 5 is a cross sectional view schematically illustrating a configuration of the plasma processing apparatus in accordance with the second embodiment. A plasma processing apparatus 50 in FIG. 5 is different from the plasma processing apparatus 10 of FIG. 1 in that there is provided an upper electrode plate 30b having hollow cathodes 31d to 31f with different depths, instead of the upper electrode plate 30a having the hollow cathodes 31a to 31c with the same depths. The depths of the hollow cathodes 31d to 31f increase as the hollow cathode is distanced away from the center of the upper electrode plate 30b.

In accordance with the second embodiment, by forming the hollow cathodes 31d to 31f at the peripheral portion of the upper electrode plate 30b corresponding to the peripheral region of the processing space S, a plasma density in the peripheral region of the processing space S can be increased, as above-mentioned in the first embodiment. Accordingly, a plasma density within the entire processing space S can be uniformized, so that a uniform plasma process can be performed on a wafer W.

Furthermore, in accordance with the second embodiment, the depths of the hollow cathodes increase as a distance of the hollow cathode from the center of the upper electrode plate 30b increases. Accordingly, a plasma density can be more increased as a distance from the center of the upper electrode plate 30b or a distance from the center of the processing space S increases. Accordingly, the plasma density within the processing space S can be more uniformized.

In the second embodiment, the depths of the hollow cathodes increase as the distance of the hollow cathode from the center of the upper electrode plate 30b increases. However, the same effect can be obtained by increasing widths or density of the hollow cathodes as the distance of the hollow cathode is distanced the center of the upper electrode plate 30b increases. Moreover, it may be effective to combine all these conditions.

Now, a modification example of the second embodiment will be explained.

Figure 6:
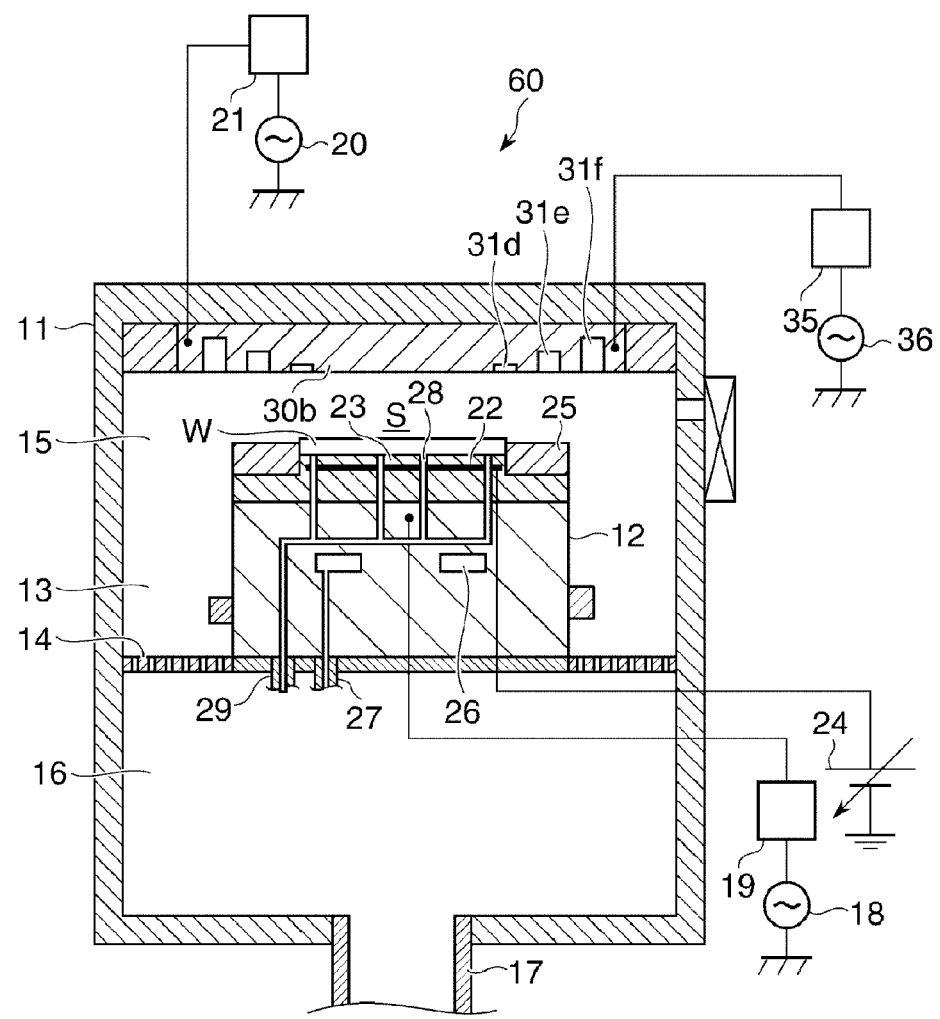
FIG. 6 is a cross sectional view schematically illustrating a configuration of a modification example of the plasma processing apparatus in accordance with the second embodiment.

FIG. 6 is a cross sectional view schematically illustrating a modification example of the plasma processing apparatus in accordance with the second embodiment of the present disclosure.

A plasma processing apparatus 60 in FIG. 6 is different from the plasma processing apparatus 50 of FIG. 5 in that, instead of the DC power supply 37 for applying the DC voltage, the high frequency power supply 36 is connected to the upper electrode plate 30*b* via the matching unit 35.

The high frequency power supply 36 applies a high frequency (RF) power having a frequency equal to or less than, e.g., about 27 MHz and a power of, e.g., about 0 kW to about 5 kW to the upper electrode plate 30*b*. By applying the high frequency power in such a frequency range and adjusting the power thereof, a bias potential Vdc in the hollow cathodes 31*d* to 31*f* can be controlled. Accordingly, a sheath voltage defined as a difference between a plasma potential Vpp and the bias potential Vdc can be controlled, so that a sheath thickness and a plasma density within a region of the processing space S facing the hollow cathodes 31*d* to 31*f* can be controlled Furthermore, as above-mentioned in the second embodiment, the plasma density can be more increased in the more peripheral region of the processing space S, so that the plasma density within the processing space S can be more uniformized, and a uniform plasma process can be performed on a wafer W.

In this modification example, although the depths of the hollow cathodes are increased as the distance of the hollow cathode from the center of the upper electrode plate 30*b* increases, the same effect can be obtained by increasing widths of the hollow cathodes.

Now, a plasma processing apparatus in accordance with a third embodiment of the present disclosure will be explained.

Figure 7:
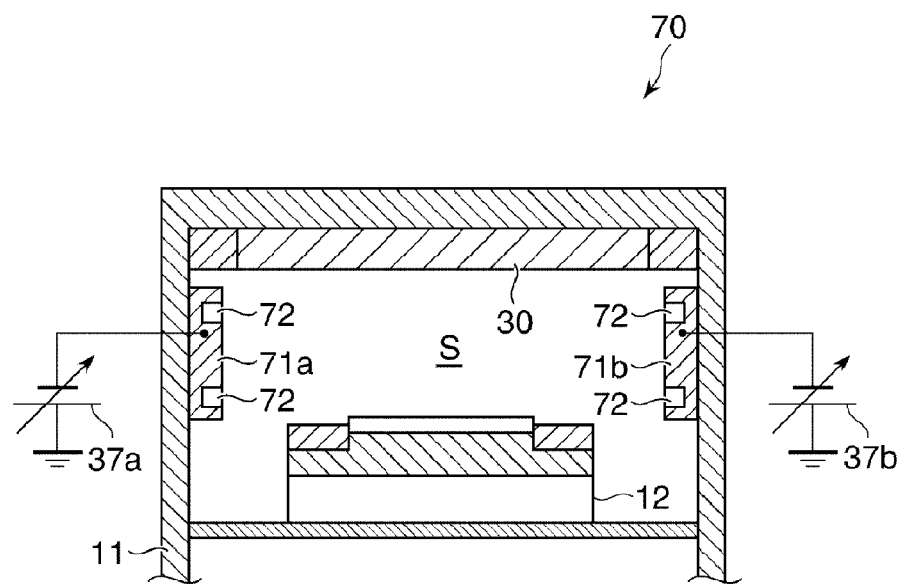
FIG. 7 is a cross sectional view schematically illustrating a configuration of major parts of a plasma processing apparatus in accordance with a third embodiment of the present disclosure.

FIG. 7 is a cross sectional view schematically illustrating a configuration of major parts of the plasma processing apparatus in accordance with the third embodiment.

In a plasma processing apparatus 70 illustrated in FIG. 7, inner wall members 71*a* and 71*b* made of a conductor such as Si are provided at left and right sidewall surfaces of the chamber 11. Hollow cathodes 72 are formed at upper and lower portions of the inner wall members 71*a* and 71*b*.

Further, the inner wall members 71*a* and 71*b* having the hollow cathodes 72 are electrically connected with DC power supplies 37*a* and 37*b*, respectively.

In accordance with the third embodiment, plasma density in upper and lower portions of the peripheral region of the processing space S can be increased, so that an overall plasma density within the processing space S can be uniformized.

That is, if plasma is generated within the processing space S of the chamber 11, a sheath is formed on a surface of a conductor facing the processing space S. Here, the surface of the conductor may not be limited to a surface of the upper electrode plate 30 but may include surfaces of the inner wall members 71*a* and 71*b* provided at the inner sidewall of the chamber 11. Thus, by forming the hollow cathodes 72 at each of the inner wall members 71*a* and 71*b* and applying DC voltages from the DC power supplies 37*a* and 37*b* while controlling powers of the DC voltages, it is possible to achieve an effect of increasing a plasma density by the hollow cathodes 72, as in the aforementioned embodiments. Accordingly, the plasma density in the upper and lower portions of the peripheral region of the processing space S can be increased, so that an overall plasma density within the processing space S can be uniformized.

In accordance with the third embodiment, although only one hollow cathode 72 is formed at each of the upper and lower portions of the inner wall members 71*a* and 71*b*, a multiple number of hollow cathodes may be formed. Moreover, although the third embodiment has been described for the case where the inner wall members 71*a* and 71*b* are perpendicular to a substrate mounting surface of the susceptor 12, the present disclosure may not be limited thereto. By way of example, the inner wall members 71*a* and 71*b* may form sidewall surfaces inclined at a certain angle with respect to the substrate mounting surface of the susceptor 12.

Now, a plasma processing apparatus in accordance with a fourth embodiment of the present disclosure will be described.

Figure 8:
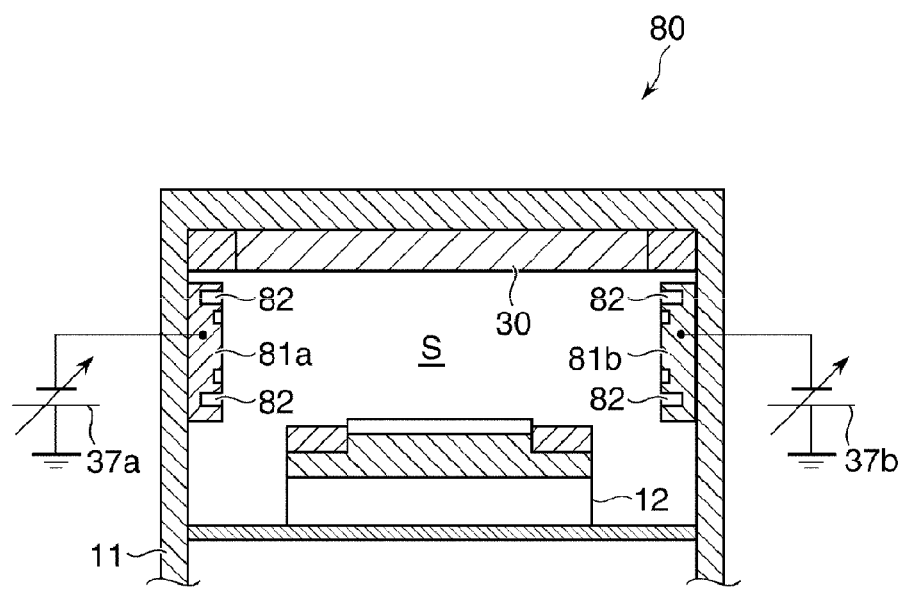
FIG. 8 is a cross sectional view schematically illustrating a configuration of major parts of a plasma processing apparatus in accordance with a fourth embodiment of the present disclosure.

FIG. 8 is a cross sectional view schematically illustrating a configuration of major parts of the plasma processing apparatus in accordance with the fourth embodiment.

A plasma processing apparatus 80 in FIG. 8 is different from the plasma processing apparatus 70 of the third embodiment in FIG. 7 in that depths of hollow cathodes 82 are increased as a distance of the hollow cathode 82 from the center of an inner wall member 81*a* or 81*b* increases in a vertical direction.

In accordance with the fourth embodiment, as in the third embodiment, a plasma density in the upper and lower portions of a peripheral region of the processing space S can be increased, so that an overall plasma density within a processing space S can be uniformized.

Moreover, in accordance with the fourth embodiment, since depths of hollow cathodes 82 are increased as a distance of the hollow cathode 82 from the center of the inner wall member 81*a* or 81*b* increases in a vertical direction, the plasma density can be more increased by the hollow cathodes in the upper and lower portions of the peripheral region of the processing space S. Accordingly, the plasma density within the processing space S can be more uniformized.

In the aforementioned embodiments, the substrate on which the plasma process is performed may not be limited to a wafer for a semiconductor device, but various kinds of substrates for use in, e.g., a flat panel display (FPD) such as a liquid crystal display (LCD), a photo mask, a CD substrate, a printed circuit board may also be used.

What is claimed is:

1. A plasma processing apparatus comprising:
   an evacuable processing chamber for performing therein a plasma process on a substrate;
   a substrate mounting table for mounting thereon the substrate within the processing chamber;
   a facing electrode disposed to face the substrate mounting table with a processing space provided therebetween; and
   a high frequency power supply for applying a high frequency power to one of the substrate mounting table and the facing electrode to generate plasma within the processing space,
   wherein grooves are formed at a portion of the facing electrode facing a peripheral region of the processing space, and the facing electrode is connected with a power supply for adjusting a sheath voltage within the grooves so as to control an existence region of the plasma within the grooves,
   wherein the grooves include an inner circular ring-shaped groove and an outer circular ring-shaped groove arranged concentrically around the inner circular ring-shaped groove, and
   wherein a width of the outer circular ring-shaped groove is larger than a width of the inner circular ring-shaped groove and/or a depth of the outer circular ring-shaped groove is larger than a depth of the inner circular ring-shaped groove.

2. The plasma processing apparatus of claim 1, wherein the power supply for adjusting the sheath voltage is a DC power supply.

3. The plasma processing apparatus of claim 2, wherein the DC power supply applies to the facing electrode a DC voltage ranging from about −50 V to about −1500 V, and an absolute value of the DC voltage is larger than that of a self bias voltage of the facing electrode.

4. The plasma processing apparatus of claim 1, wherein the power supply for adjusting the sheath voltage is a high frequency power supply that applies a high frequency power of a frequency range equal to or less than about 27 MHz.

5. The plasma processing apparatus of claim 4, wherein the high frequency power supply applies to the facing electrode a high frequency power of about 0 kW to about 5 kW.

6. The plasma processing apparatus of claim 1, wherein the grooves are formed concentrically and coaxially with respect to the substrate mounting table.

7. The plasma processing apparatus of claim 1, wherein, a width of the groove is about 2 mm to about 20 mm.

8. The plasma processing apparatus of claim 1, wherein, a depth of the groove is about 2 mm to about 20 mm, and an aspect ratio of the groove is about 0.5 to about 10.

9. The plasma processing apparatus of claim 1, wherein, a bottom corner of the groove is rounded.

10. A plasma control method performed by a plasma processing apparatus that accommodates a substrate in a processing space of an evacuable processing chamber for performing a plasma process on the substrate; generates plasma within the processing space by capacitive coupling; and performs the plasma process on the substrate by the plasma, the plasma processing apparatus comprising grooves formed in a facing electrode facing a peripheral region of the processing space, the plasma control method comprising:

applying a voltage for adjusting a sheath voltage to the facing electrode in which the grooves are formed to control an existence region of the plasma within the grooves, wherein the grooves include an inner circular ring-shaped groove and an outer circular ring-shaped groove arranged concentrically around the inner circular ring-shaped groove, and wherein a width of the outer circular ring-shaped groove is larger than a width of the inner circular ring-shaped groove and/or a depth of the outer circular ring-shaped groove is larger than a depth of the inner circular ring-shaped groove.

11. The plasma control method of claim 10, wherein the voltage for adjusting the sheath voltage is a DC voltage.

12. The plasma control method of claim 11, wherein the DC voltage is about −50 V to about −1500 V, and an absolute value of the DC voltage is larger than that of a self bias voltage of the facing electrode.

13. The plasma control method of claim 10, wherein the voltage for adjusting the sheath voltage is a high frequency power of a frequency range equal to or less than about 27 MHz.

14. The plasma control method of claim 13, wherein the high frequency power supply applies a high frequency power of about 0 kW to about 5 kW.

15. A plasma processing apparatus comprising:

an evacuable processing chamber for performing therein a plasma process on a substrate;

a substrate mounting table for mounting thereon the substrate within the processing chamber;

a facing electrode disposed to face the substrate mounting table with a processing space provided therebetween;

a high frequency power supply for applying a high frequency power to one of the substrate mounting table and the facing electrode to generate plasma within the processing space; and an inner wall member facing the processing space, wherein grooves are formed at a portion of the inner wall member facing a peripheral region of the processing space, and the inner wall member is connected with a power supply for adjusting a sheath voltage within the grooves so as to control the existence region of the plasma within the grooves, wherein the grooves include a first circular ring-shaped groove and a second circular ring-shaped groove coaxial with the first circular ring-shaped groove and located at a greater distance from a center of the processing space than the first circular ring-shaped groove, and wherein a width of the second circular ring-shaped groove is larger than a width of the first circular ring-shaped groove and/or a depth of the second circular ring-shaped groove is larger than a depth of the first circular ring-shaped groove.

* * * * *

UNITED STATES PATENT AND TRADEMARK OFFICE
CERTIFICATE OF CORRECTION

PATENT NO.        : 8,829,387 B2                    Page 1 of 1
APPLICATION NO.   : 13/206607
DATED             : September 9, 2014
INVENTOR(S)       : Chishio Koshimizu et al.

It is certified that error appears in the above-identified patent and that said Letters Patent is hereby corrected as shown below:

In the Specification,

Column 5, line 35, please add -- 60 -- between "about" and "MHz"

Signed and Sealed this
Twenty-fourth Day of February, 2015

Michelle K. Lee
*Deputy Director of the United States Patent and Trademark Office*